United States Patent [19]
Shibata et al.

[11] Patent Number: 5,608,340
[45] Date of Patent: Mar. 4, 1997

[54] FOUR-TERMINAL SEMICONDUCTOR DEVICE

[75] Inventors: Tadashi Shibata; Tadahiro Ohmi, both of Sendai, Japan

[73] Assignee: Tadashi Shibata, Sendai, Japan

[21] Appl. No.: 60,362

[22] Filed: May 11, 1993

Related U.S. Application Data

[63] Continuation of Ser. No. 777,352, Jan. 6, 1992, Pat. No. 5,258,657.

[30] Foreign Application Priority Data

Jun. 2, 1989 [JP] Japan .................... 2-141463

[51] Int. Cl.$^6$ .................... H03K 19/23; H03K 19/094
[52] U.S. Cl. ............................... 326/36; 326/121
[58] Field of Search .................... 307/201, 450, 307/464; 364/807; 395/21; 326/121, 122, 83

[56] References Cited

U.S. PATENT DOCUMENTS

| | | | |
|---|---|---|---|
| 2,900,531 | 8/1959 | Wallmark | 307/304 |
| 3,010,033 | 11/1961 | Noyce | 307/304 |
| 3,204,160 | 8/1965 | Sah | 307/304 |
| 4,654,548 | 3/1987 | Tanizawa et al. | 326/122 |
| 4,950,917 | 8/1990 | Holler et al. | 307/201 |
| 4,951,239 | 8/1990 | Andes et al. | 364/807 |
| 4,961,002 | 10/1990 | Tam et al. | 307/201 |
| 4,999,525 | 3/1991 | Park et al. | 307/201 |
| 5,021,693 | 6/1991 | Shima | 307/494 |
| 5,028,810 | 7/1991 | Castro et al. | 307/201 |
| 5,070,256 | 12/1991 | Grondalski | 326/121 |
| 5,095,230 | 3/1992 | Takai et al. | 326/83 |
| 5,192,879 | 3/1993 | Aoki et al. | 326/121 |
| 5,258,657 | 11/1993 | Shibata et al. | 307/464 |

*Primary Examiner*—Edward P. Westin
*Assistant Examiner*—Richard Roseen
*Attorney, Agent, or Firm*—Baker & Daniels

[57] ABSTRACT

A semiconductor device of this invention comprises on a substrate a first semiconductor region of one conductive type, first source and drain regions of the opposite conductive type formed in said semiconductor region, a first gate electrode formed in a region separating said source and drain regions, the first gate electrode being electrically floating through an insulating film, and at least two second gate electrodes connected to said first gate electrode by capacitive coupling, wherein an inversion layer is formed under said first gate electrode and said first source and drain regions are electrically connected together only when a predetermined threshold value is exceeded by the absolute value of a value obtained by linearly summing up the weighted voltages applied to said second gate electrodes.

12 Claims, 13 Drawing Sheets

$$Z = \sum_{i=1}^{n} w_i V_i$$

FOUR-TERMINAL SEMICONDUCTOR DEVICE

This is a continuation of application Ser. No. 07/777,352, filed Jan. 6, 1992, now U.S. Pat. No. 5,258,657.

BACKGROUND OF THE INVENTION

This invention relates to a semiconductor device, and more particularly a semiconductor device which provides a functional semiconductor integrated circuit such as a neuron circuit computer and a multi-valued logic integrated circuit.

BACKGROUND OF THE INVENTION

Semiconductor integrated circuit technology has rapidly progressed. For example, in the case of dynamic memory, memory chips with a capacity of 1 though 4 Mbit have been already put into mass production and ultra large integration memory chips such as 16 Mb or 64 Mb memory are now being developed. Such an ultra large integration technology is applied to a logic circuit as well as a memory circuit, and a variety of functional logic integrated circuits represented by 32 bit CPU or 64 bit CPU are also under development.

In these logic circuits, an arithmetic operation is carried out by using digital signals, i.e., binary signals composed of 1 and 0. For example, a Neumann method is adopted for a computer, where commands are executed one by one according to a predetermined program. Although simple numerical calculations can be carried out at very high speed by this method, it takes a lot of time to perform the pattern recognition or image processing. Furthermore, this method is not suitable for information processing such as association of ideas, memorizing and learning, which is mankind's strongest point. In spite of a lot of research and development activities for software technology, notable results have not been produced yet.

There has been another stream of research to get rid of these difficulties at once and then to construct a computer which imitates arithmetic operations of the brain, i.e., neuron circuit computer (neural computer) by studying brain function of a living things. This kind of research began in the 1940s and has become very active in last several years based on the fact that the progress in LSI technology may make it possible to realize the hardware of neuron computer.

However, the present semiconductor LSI technology still has too many problems to put it into practice. This is described more concretely. For example, in order to make the hardware with the function of one human neuron cell (neuron), a circuit must be constructed by combining a lot of semiconductor elements. In other words, it is very difficult to construct the practical number of neurons on a semiconductor chip.

The main purpose of this invention is to provide a semiconductor device which realizes the function of a neuron using a single MOS type semiconductor element. Before detailed explanation of this invention is described, what function is requested for one neuron and what difficulties take place when constructing neuron using current technologies are described.

FIG. 19 is a schematic representation illustrating the function of a neuron cell, i.e., neuron, which was proposed by McCumllock and Pitts as a mathematical model of neuron (Bull. Math. Biophys., Vol.5, p.115 (1943)). At present, the studies are being carried out actively to construct a neuron computer by realizing this model with semiconductor circuits, $V_1$, $V_2$, $V_3$, ..., $V_n$ are n input signals defined as, for example, magnitudes of voltages, and correspond to signals transferred from another neurons. $W_1$, $W_2$, $W_3$, ..., $W_n$ are coefficients representing the coupling strength between neurons, and are biologically called synapse coupling. The function of this neuron is simple. When the value Z, linear sum of the product of each input $V_i$ and weight $W_i$ (i=1–n), becomes larger than a predetermined threshold value $V_{TH}{}^*$, the neuron outputs 1; on the other hand, 0 when Z is less than $V_{TH}{}^*$. The numerical expression is as follows:

$$Z = \sum_{i=1}^{n} W_i V_i \qquad (1')$$

$$V_{out} = \begin{cases} 1 \ (Z > V_{TH}{}^*) & (2') \\ 0 \ (Z < V_{TH}{}^*) & (3') \end{cases}$$

FIG. 19(b) shows the relationship between Z and $V_{out}$. The output is 1 when Z is large enough as compared with $V_{TH}{}^*$, and 0 when Z is small enough.

Next, an example of the circuits to realize the above-mentioned function using conventional semiconductor technology is shown in FIG. 20. In the FIG., 102-1, 102-2 and 102-3 denote operational amplifiers. FIG. 20(a) shows a circuit to obtain Z by adding the product of input signal $V_i$ (i=1–n) and weight Wi. $I_i$ denotes electric current flowing through $R_i$. From $I_i = V_i/R_i$, $$I_a = \sum_{i=1}^{n} (V_i/R_i)$$

the output voltage $V_a$ of the operational amplifier 102-1 is given by $$V_a = -R \sum_{i=1}^{n} (V_i/R_i).$$

Since $I_b$) is given by $-V_a/R$, $I_a$ and $I_b$ have the same magnitude ($I_a=I_b$) and the opposite direction of flow, leading to the expression:

$$Z = R \sum_{i=1}^{n} (V_i/R_i) = \sum_{i=1}^{n} (R/R_i) V_i \qquad (4')$$

By the comparison between Eqs. (1') and (4') the weight coefficient $W_i$ is found to be $R/R_i$ and therefore determined by the resistance. The circuit shown in FIG. 20 (a) is a circuit to generate the voltage representing the linear sum of input signals obtained by summing up electric currents. FIG. 20(b) is an example of circuit to convert the value of Z into $V_{out}$, where Z is connected to a non-inversion input terminal of operational amplifier 102-3. Since an operational amplifier is an amplifier having a large voltage amplification (gain), $V_{out}=V^+$ when $Z>E_0$ and $V_{out}=V^-$ when $Z<E_0$, as shown in FIG. 20(c). Here, $V^+$ and $V^-$ are the maximum and the minimum values of outputs which are determined by power supply voltage supplied to the operational amplifier. The value of $V_{TH}{}^*$ can be changed by varying the voltage $E_0$ applied to non-inversion terminal. One of the problems of the circuit shown in FIGS. 20(a) and (b) is such that a lot of semiconductor elements are required to construct a neuron. Three operational amplifiers are used in the circuit of the figure and therefore 30 transistors are necessary since at least 10 transistors are usually required to construct one operational amplifier. And since the sum operation is made on the basis of electric current mode, a large amount of current always flow, resulting in large power dissipation. Namely, one neuron not only occupies a large area on a chip but also dissipates much power. Therefore it is difficult to attain large scale integration. Even if large scale integration can be attained by shrinking the dimensions of transistor, it is almost impossible to construct a practical integrated circuit because of high density of the power dissipation.

The present invention has been made in order to solve such problems as mentioned above and to provide a semiconductor device which realizes the function of one neuron with a single element and a neuron computer chip having a high integration density and low power dissipation characteristics.

SUMMARY OF THE INVENTION

A semiconductor device of the present invention comprises a MOS type semiconductor element having a gate electrode being electrically floated and a plurality of input gate electrodes capacitively coupled with said gate electrode, wherein the channel is formed under said gate electrode being electrically floated only when the absolute value of a value obtained by linearly summing up the weighted voltage applied to said input gate electrodes becomes larger than a predetermined threshold value.

By the present semiconductor device, which makes it possible to realize the function of a neuron with a single element, ultra large scale integration of neuron elements becomes possible.

Furthermore, since the power dissipation can be remarkably reduced as compared with prior arts, it first becomes possible to realize a neuron circuit at practical application level.

BRIEF DESCRIPTION OF THE DRAWINGS

FIG. 1 shows schematic diagrams explaining the embodiment 1.

FIG. 2 shows schematic diagrams explaining the embodiment 2.

FIG. 5 shows schematic diagrams explaining the embodiment 5.

FIG. 13 shows schematic diagrams explaining the embodiment 9.

FIG. 19 shows diagrams explaining prior arts.

Figure 1A:
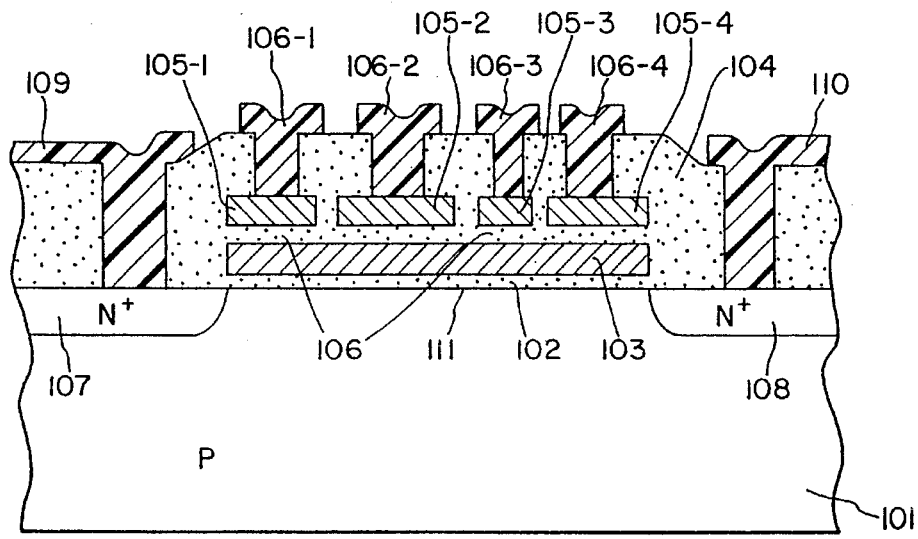
FIG. 1(a) is a cross-sectional view of a device.

A list of parts and numerals shown in the drawings is as follows: 102-1,102-2,102-3, arithmetic amplifier (operational amplifier); 101, p-type Si substrate; 102, gate oxide film; 103, gate electrode; 104, insulating film; 105-1–105-4, gate electrode; 106, insulating film; 106-1–106-4, Al interconnect; 107, source; 108, drain; 109, Al interconnect; 111, surface of silicon substrate; 201, floating gate; 202, gate oxide film; 203, floating gate; 204, insulating film; 205-1–205-4, input gate; 206, insulating film; 206-1–206-4, Al interconnect connected to input gate; 207, source; 208, drain; 209, 210, Al interconnect; 301, neuron element; 303, input terminal for signal voltage; 304, output terminal; 305, input terminal for control signal X; 401-1, 401-3,401-5, input gate: 402, insulating film; 403, floating gate; 404, thermal oxidation film; 405, p-type Si substrate; 406, field oxide film; 407, Al interconnect; 501, field oxide film; 502, source; 503, drain; 504, floating gate; 505, input gate; 603, floating gate; 604, input gate; 605, control gate; 606, oxide film; 607, gate oxide film; 608, oxide film; 701, mode MOS transistor; 702, n-channel enhancement mode transistor; 801, n-channel νMOS; 802, p-channel νMOS; 803, p-type substrate; 804, n-type substrate; 805, floating gate; 806,807, gate insulating film; 808-1–808-4, input gate; 809, source; 810, drain; 811, source; 812, drain; 813,814,815, Al interconnect; 816, insulating film under Al interconnect; 817, 817',817'',817''', contact hole; 818, insulating film; 901, C-νMOS; 902, CMOS inverter; 1001, NMOS; 1201,1202, input gate; 1203, floating gate; 1401, C-νMOS; 1402, source; 1403, CMOS inverter; 1404, source; 1405, p-MOSFET; 1406, n-MOSFET; 1501, νMOS; 1602,1603, inverter.

DETAILED DESCRIPTION OF THE PREFERRED EMBODIMENTS (Embodiment 1)

FIG. 1 is a cross-sectional view of a semiconductor device according to the embodiment 1. A gate electrode 103 made of n$^+$ polysilicon is formed over a p-type Si substrate 101 through a gate oxide film 102. Surrounded by an insulating film 104 such as SiO$_2$, this gate electrode is left in an electrically floating state.

Input gate electrodes 105-1–105-4 made of, e.g., n$^+$ polysilicon are isolated from floating gate 103 by a insulating film 106 such as SiO$_2$. The potential of these input electrodes is determined by the voltage supplied through Al interconnects 106-1–106-4.

107 and 108 are a source and a drain, respectively, which are, for example, formed by ion-implanting an As ion. 109 and 110 are interconnects connected to the source and the drain, respectively. The semiconductor device of this invention has the following function: when the linear sum of the products of the voltages $V_1$, $V_2$, $V_3$, $V_4$ applied to the gate electrodes 105-1 to 105-4 and corresponding weights exceeds a predetermined threshold value, an inversion layer (i.e., channel) is formed on the silicon substrate surface 111, and the source and the drain are electrically connected together. A detailed explanation about the linear sum operation of voltages of the device is described below.

Figure 1B:
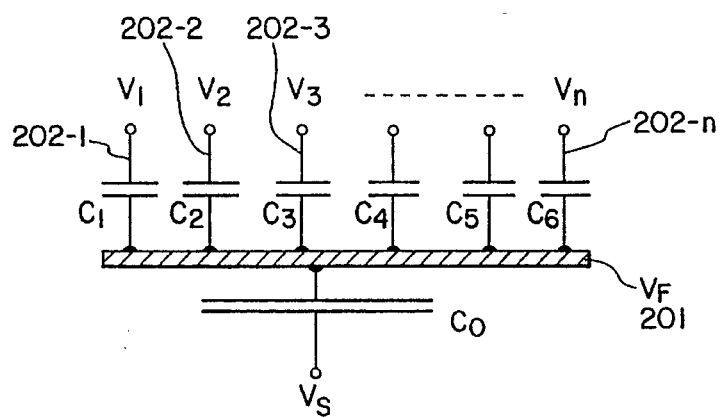
FIG. 1(b) is an equivalent circuit of the device.

First, the discussion is made on the device of FIG. 1(a) using a generalized model shown in FIG. 1(b). 201 denotes a floating gate, corresponding to 103 in FIG. 1(a). This model is generalized to have n control gates 202-1, 202-2, 202-3, ..., 202-n based on the case of FIG. 1(a) having four control gates 105-1, 105-2, 105-3 and 105-4. $C_1$, $C_2$, $C_3$, ... $C_n$ denote the capacitive coupling coefficients (capacitance) between the floating gate and respective gates. $C_0$ is the capacitance between the floating gate and the substrate 101.

Now, symbols are defined as follows: $V_F$ is the potential of the floating gate, $V_1$, $V_2$, $V_3$, ... $V_n$ are the voltages supplied to respective input gates and $V_0$ is the potential of the substrate. Let $Q_1$, $Q_2$, $Q_3$, ... and $Q_n$ denote charges stored in the capacitances $C_1$, $C_2$, $C_3$, ... and $C_n$, which are obtained as $Q_0 = C_0(V_0 - V_F)$, $Q_1 = C_1(V_1 - V_F)$, $Q_2 = C_2(V_2 - V_F)$, ... and $Q_n = C_n(V_n - V_F)$. Namely, total charge $Q_F$ in the floating gate is given by $$Q_F = \sum_{i=0}^{n}(-Q_i)$$
$$= -\sum_{i=0}^{n} C_i(V_i - V_F)$$
$$= -\sum_{i=0}^{n} C_i V_i + V_F \sum_{i=0}^{n} C_i.$$

Therefore, $V_F$ is obtained as the following expression.

$$V_F = \left(\sum_{i=0}^{n} C_i V_i + Q_F\right)/C_{TOT} \quad (1)$$

where $$C_{TOT} = \sum_{i=0}^{n} C_i.$$

The device shown in FIG. 1(a) can be regarded as a MOSFET having a threshold voltage of $V_{TH}$ in which the floating gate 103 works as a gate electrode thereof. In other words, a channel is formed on the substrate surface 111 when the potential of the floating gate 103 becomes $V_{TH}$ volt. For the case $V_F > V_{TH}$, Eq. (1) is written as $$Z \equiv \sum_{i=0}^{n} W_i V_i > V_{TH} - (C_0/C_{TOT})V_0 - Q_F/C_{TOT} \quad (2)$$

where $$W_i = C_i/C_{TOT}.$$

Eq. (2) means that when the value of the linear sum of all input voltages to the gates 202-1, 202-2, 202-3, ... and 202-n weighted by $W_1$, $W_2$, $W_3$, ... and $W_n$ becomes larger than $V_{TH}^*$ given by Eq. (3), the device turns on and the source and the drain are connected.

$$V_{TH}^* \equiv V_{TH} - (C_0/C_{TOT})V_0 - Q_F/C_{TOT} \quad (3)$$

Here, usually, the substrate is grounded, that is, $V_0 = 0$, and the total charge in the floating gate is 0. Then, $$V_{TH} = V_{TH}^*. \quad (4)$$

As mentioned above, the semiconductor device of this invention has the function to calculate the weighted linear sum of all input signals and to control the on and off of the MOS transistor based on the comparison between the results of the weighted sum and the threshold $V_{TH}$. In other words, this device is quite a new transistor with which a high arithmetic operation function is realized in a single element level. Thus, this device is very suitable for constructing a neuron computer which will be described later. For this reason, this transistor is called neuron transistor or ν(neu) MOS in short.

Figure 1C:
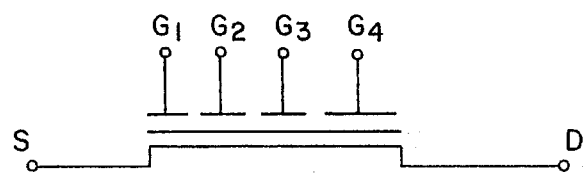
FIG. 1(c) is a schematic diagram of circuit.

FIG. 1(c) shows a symbol for νMOS, where S is a source, D is a drain and $G_1$, $G_2$, $G_3$ and $G_4$ are gates.

Figure 1D:
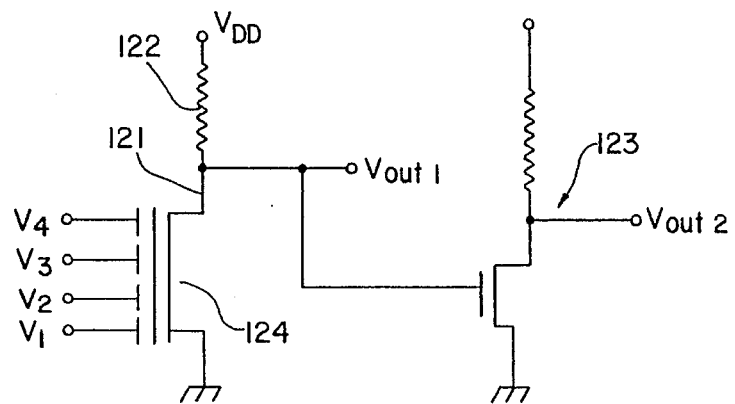
FIG. 1(d) is another example of circuit.
Figure 1E:
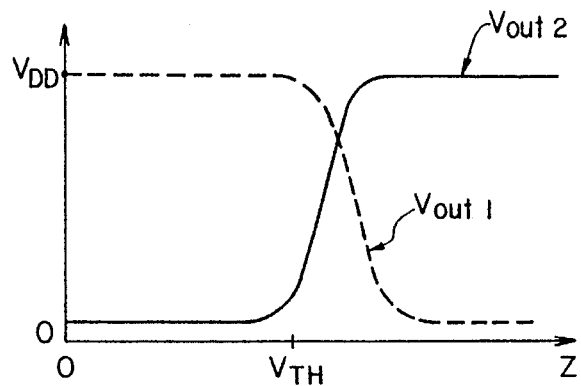
FIG. 1(e) is a graph showing characteristics.
Figure 19A:
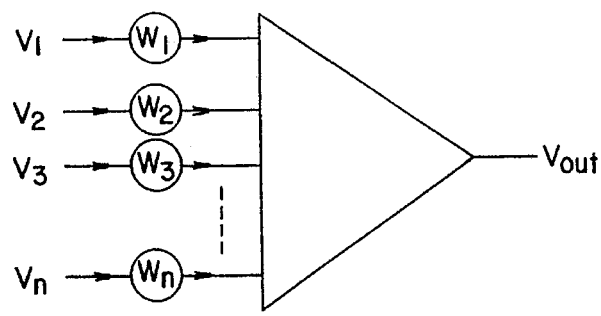
FIG. 19(a) is a schematic diagram and FIG. 19(b) is a graph showing characteristics.
Figure 19B:
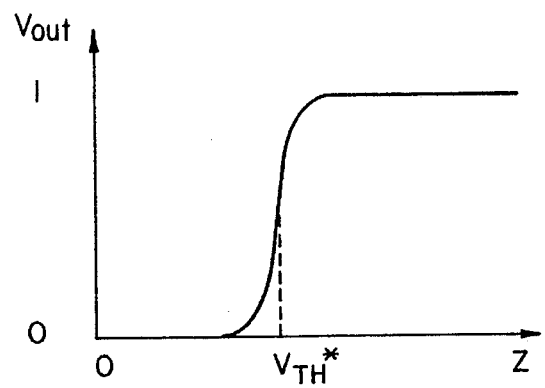
Figure 20A:
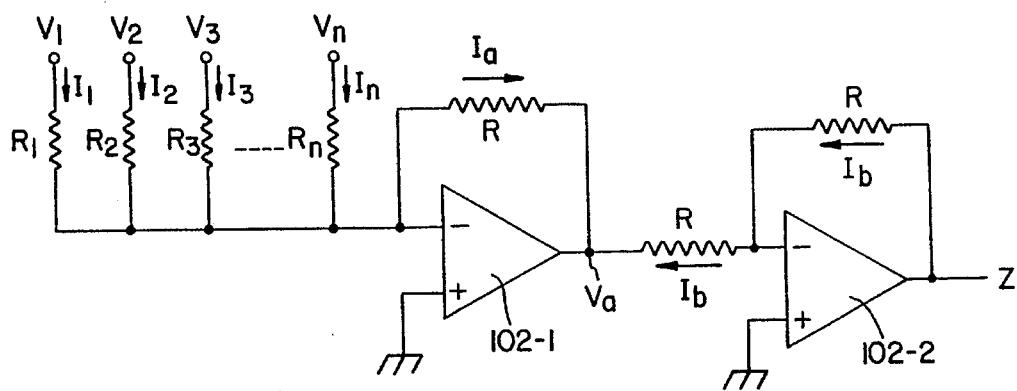
FIG. 20 is a diagram of a circuit explaining a prior art.
Figure 20B:
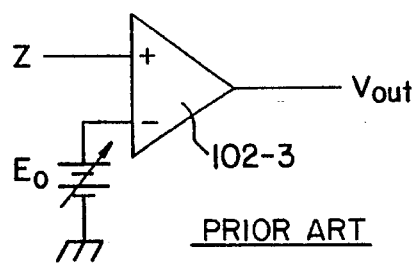
Figure 20C:
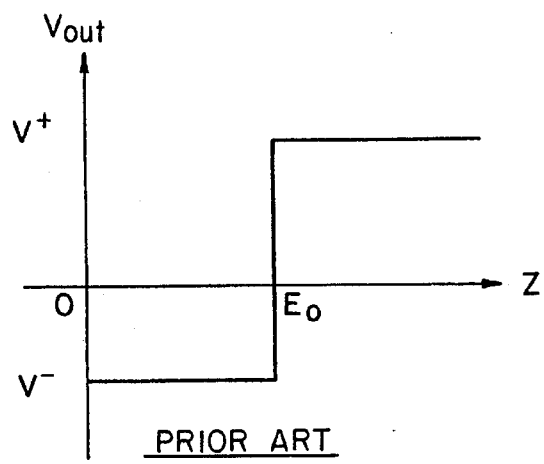

The structure of a neuron element is described in FIG. 1(d) using symbols. This is another example of the embodiment. A drain 121 of νMOS is connected to a power supply line ($V_{DD}$) through a load 122. When $Z = W_1 V_1 + W_2 V_2 + W_3 V_3 + W_4 V_4$ in this circuit, the relation between $V_{out1}$ and Z is shown by the broken line of FIG. 1(e). In the case where $V_{out}$ is connected to an ordinary inverter 123, the output $V_{out2}$ is shown by the solid line of FIG. 1(e). That is to say, the function of one neuron shown in FIG. 19(a) is realized by using this simple circuit. The effect of this invention is definitely understood from the comparison of FIG. 1(d) with FIGS. 20(a) and 20(b) representing the prior art only two MOS transistors are required to construct one neuron in this invention while at least 30 transistors are required in the prior art. In other words, it first becomes possible to lessen the area on a chip by more than one order and therefore realize ultra large scale integration. Furthermore, in the prior art, the circuit is constructed with bipolar transistors which conduct large current and the sum operation is made by utilizing current additivity, resulting in large power dissipation. On the other hand, constructed with only two MOS transistors in this invention, the circuit dissipates very little power. An MOS is, by nature, a voltage-controlled device which can control the on and off with a slight amount of charge. Therefore, the power dissipation is very little. In addition, because of νMOS having the function of direct sum of input voltages, the circuit does not require the conversion operation from voltage into current for sum operation, unlike the case in FIG. 20(a) where sum operation is made after the voltages are converted into currents, suggesting that this neuron is capable of low power dissipation operation. For these reasons; high integration density and low power dissipation, it becomes possible for the first time to construct the circuit which can be used for a neuron computer at practical use level.

Figure 1F:
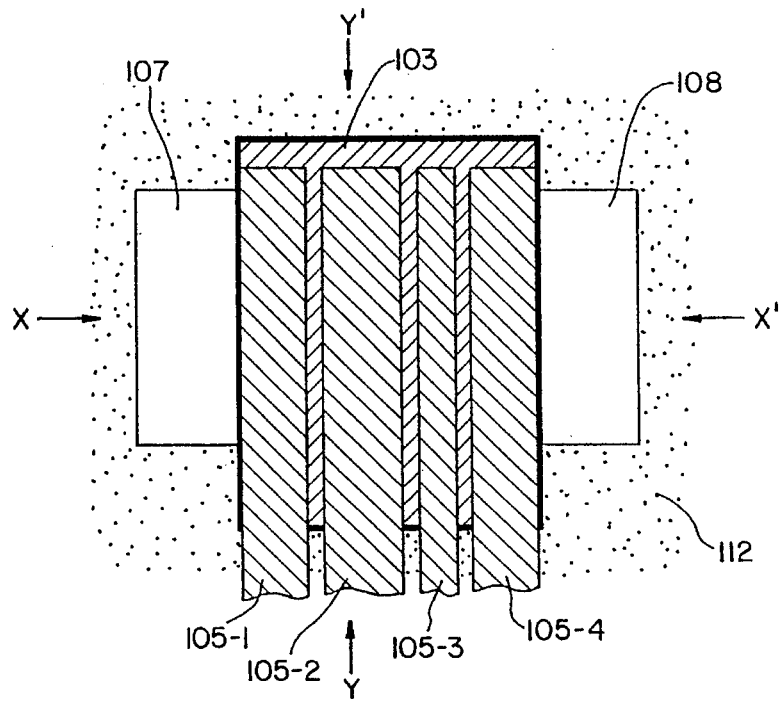
FIG. 1(f) is a plan view of a device and FIG. 1(g) is a cross-sectional view along Y–Y' line of FIG. 1(f).

FIG. 1(f) is a plan view of νMOS shown in FIG. 1(a). In this figure, the same numerals are used as those in FIG. 1(a): 107 and 108 are a source and a drain, 105-1 to 105-4 are four input gates and 103 is a floating gate. The cross-section along X–X' line corresponds to FIG. 1(a). Here, however, an insulating film 104, aluminum interconnects 109, 110, 106-1–106-4 are omitted to easily understand the drawing. These parts are formed at appropriate sites.

Figure 1G:
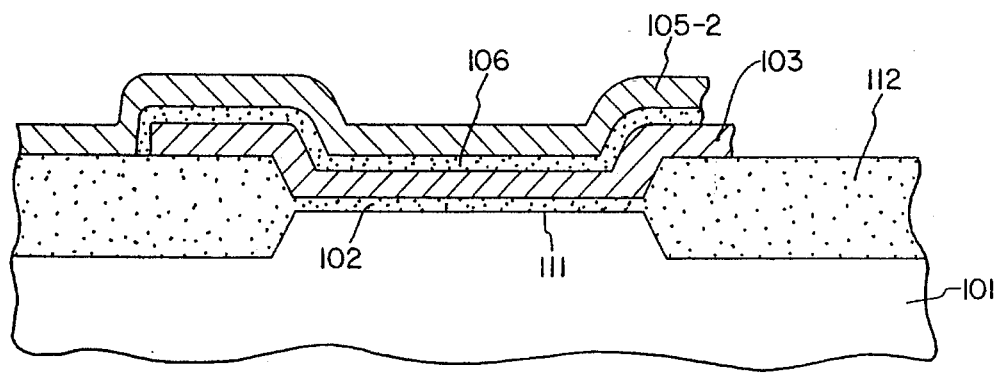

FIG. 1(g) is a cross-sectional view along Y–Y' line of FIG. 1(f). Common numerals are also used in the figure. Here, 112 is a field oxide film to isolate elements.

Next, a concrete example of how to prepare elements is described. In the embodiment shown in FIGS. 1(a), 1(f) and 1(g), a p-type substrate with (100) plane and a specific resistance of 0.5 Ω.cm was used, and each parameter is designed as follows: the thickness of the gate oxide film ($SiO_2$) is 500 A, that of the insulting film ($SiO_2$) between the floating gate and the input gates is 500 A, the overlapping area between the floating gate and the channel forming region is 3 μm×3.5 μm, and those between the floating gate and input gates 105-1, 105-2, 105-3 and 105-4 are 4 μm×0.75 μm, 4 μm×1.0 μm, 4 μm×0.5 μm and 4 μm×0.75 μm, respectively. Since the field oxide film is thick, for example, about 1 μm, capacitances of the regions where the field oxide film is put between the floating gate 103 and the substrate 101, or between the control gate 105 and the substrate 101 are so small as to be neglected. Calculation based on such data gives $$C_0:C_1:C_2:C_3:C_4=10.5:3:4:2:3$$

and $$Z=0.13V_1+0.18V_2+0.089V_3+0.13V_4. \qquad (5)$$

If $V_5=0$ and no charge injection into the floating gate is assumed to occur, $V_{TH}^*$ becomes about 1.0 V from Eq. (4). In the case of $V_1=0$ V, $V_2=5$ V, $V_3=5$ V and $V_4=5$ V, $Z=2.0$V and $V_{out2}$ in FIG. 1(d) becomes 5 V. And in the case of $V_1=0$ V, $V_2=0$ V, $V_3=5$ V and $V_4=0$ V, $Z=0.45$ V and $V_{out2}$ becomes about 0 V (low level). Although only the cases of input signals being either 0 or 5 V are discussed, it is also possible for the cases of input values being intermediates between 0 and 5 V or negative values. Furthermore, $V_{out2}$ is used as output of this neuron, but the inversion output $V_{out1}$ can also be used directly as output.

(Embodiment 2)

Figure 2A:
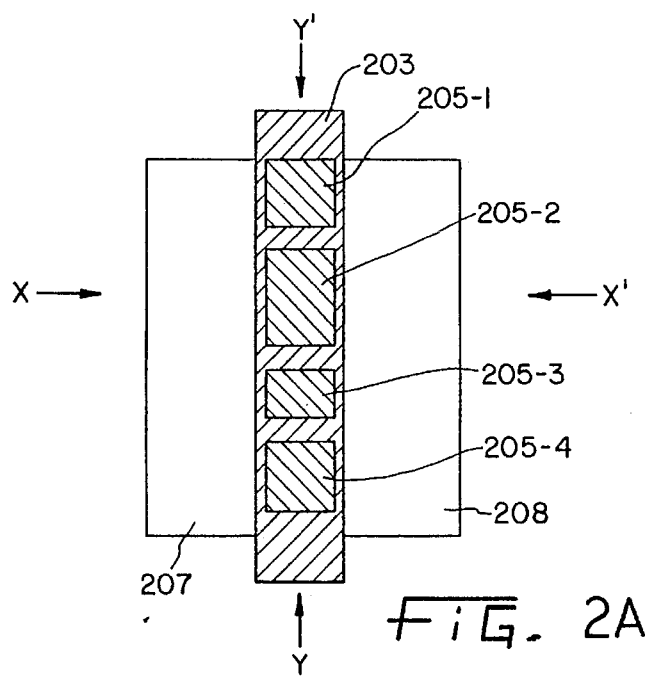
FIG. 2(a) is a plan view of a device.
Figure 2B:
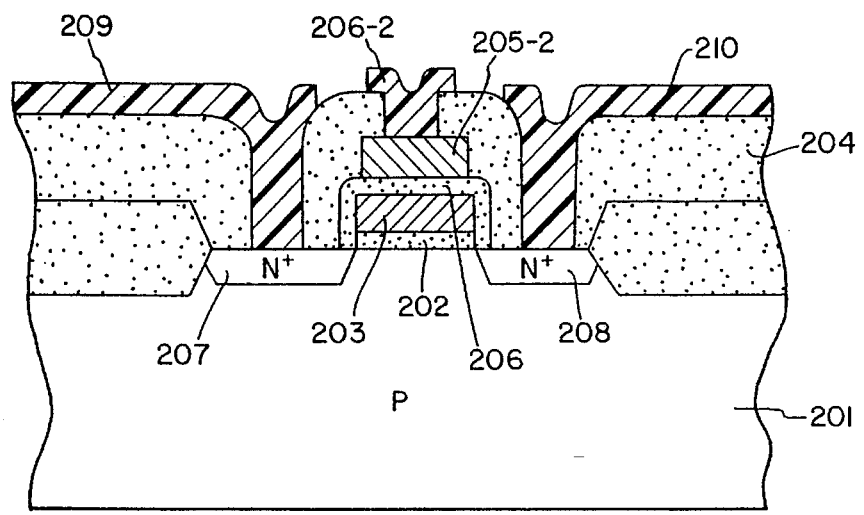
FIG. 2(b) is a cross-sectional view along X–X' of FIG. 2(a) line and FIG. 2(c) is a cross-sectional view along Y–Y' line of FIG. 2(a).
Figure 2C:
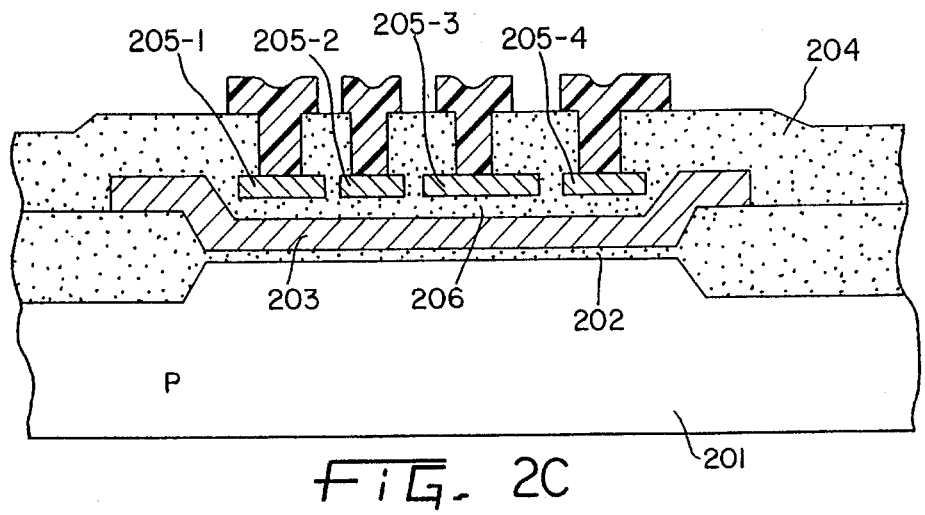

As is apparent from FIG. 1(f), in the embodiment 1 shown in FIGS. 1(a), 1(f) and 1(g), a channel length of νMOS inevitably becomes long since input gates are aligned along the channel, i.e., X–X' direction. This is unsuitable for high speed operation. So, the second embodiment which make it possible to shorten a channel of νMOS is described. FIG. 2(a) is a plan view. FIGS. 2(b) and 2(c) are cross-sections along X–X' and Y–Y' lines of FIG. 2(a), respectively. Al interconnects and interlayer insulating films are omitted in FIG. 2(a) for simplicity. 201 is, for example, a p-type substrate, 207 and 208 are a source and drain, respectively, 202 is a gate oxide film, 203 is a floating gate, 205-1 to 205-4 are input gates, 206-1 to 206-4 are Al interconnects connected to input gates, 209 and 210 are Al interconnects connected to the source and the drain, respectively, 206 is an insulating film between the floating film and input gates, and 204 is an insulating film under Al interconnects. When νMOS is designed in such a manner that the overlapping area between the floating gate and the channel forming region is 1 μm×4 μm, those between the floating gate and input gates 205-1, 205-2, 205-3 and 205-4 are 1 μm×0.75 μm, 1 μm×1 μm, 1 μm×0.5 μm and 1 μm×0.75 μm, respectively, and the other parameters are the same as those in FIG. 1(a), Z is given by $$Z=0.107\ V_1+0.143\ V_2+0.071\ V_3+0.107\ V_4. \qquad (6)$$

Here, $V_1$, $V_2$, $V_3$ and $V_4$ denote applied voltages to input gates 205-1, 205-2, 205-3 and 205-4, respectively. If the circuit shown in FIG. 1(d) is constructed using such a transistor, $Z=1.78$ and $V_{out2}=5$ V in the case of $V_1=5$ V, $V_2=5$ V, $V_3=0$ V and $V_4=5$ V; on the other hand $Z=0.99$ and $V_{out2}=0$ V in the case of $V_1=0$ V, $V_2=0$ V, $V_3=5$ V and $V_4=5$ V. These results apparently mean that this circuit can perform neuron operation.

In the embodiments 1 and 2, the weight by which the input voltage is multiplied is determined by the ratio of capacitance $C_i$ (i=1–4) of overlapping region between the floating gate and the input gate to total capacitance, $$C_{TOT}=\sum_{i=1}^{4} C_i.$$

Thus, it is possible to change the weight freely by varying the overlapping area between the floating gate and the input gate. The capacitance can also be changed by employing other materials of insulator formed between the floating gate and the input gates, i.e., by varying dielectric constant of insulator. For example, the capacitance ratio becomes about 1:2:2.3 for $SiO_2:Si_3N_4:Al_2O_3$ even if the overlapping area is equal. As a matter of course, a large ratio can be obtained by changing both the overlapping area and material. In order to obtain larger capacitive coupling coefficient with especially small area, that is, in order to obtained especially large weight coefficients $W_i$ (i=1–4), materials with large dielectric constant such as $Ta_2O_5$ are used. The weight is about five times as large in this case as that in the case where $SiO_2$ with the same overlapping area is used. Furthermore, changing the insulating film thickness can also cause the change in capacitance, i.e., weight coefficient.

(Embodiment 3)

Figure 3:
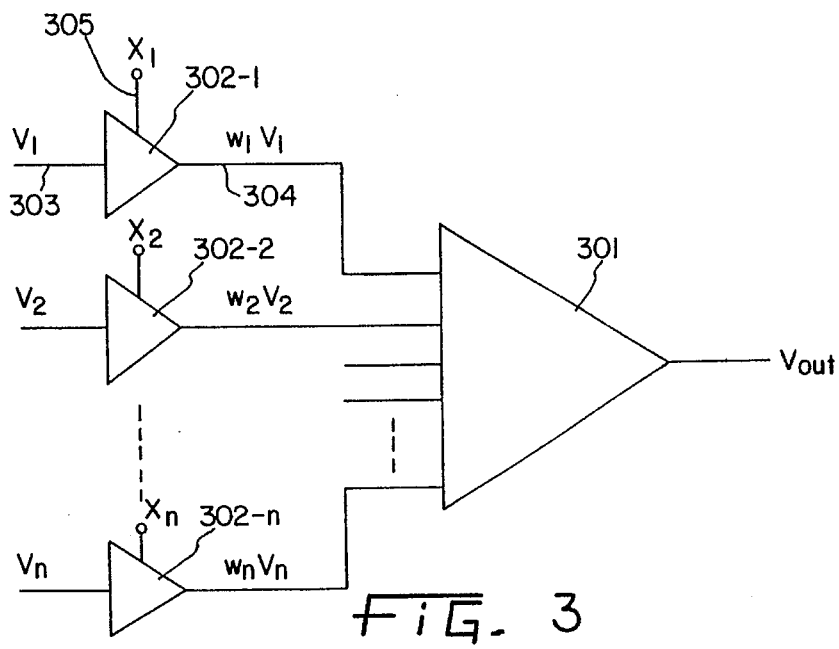
FIG. 3 is a block diagram explaining the embodiment 3.

In the embodiments 1 and 2 mentioned above, the weight coefficients ($W_1$–$W_4$) by which input signals are multiplied are determined by the νMOS structure and therefore cannot be changed after the element is constructed. The third embodiment of the present invention shown in FIG. 3 is a neuron which makes it possible to freely change the weight coefficients even after the element is constructed. 301 is a neuron element, composed of e.g., a circuit shown in FIG. 1(d). Other neuron elements are also used which will be described in other embodiments using FIGS. 4, 5, 6 and 8. 302-1, 302-2, 302-n are circuits to output the values of input signal voltage $V_1, V_2, \ldots V_n$ weighted by $W_1, W_2, W_n$. The circuit 302-1, for example, has at least three terminals 303, 304 and 305. 303 is an input terminal for signal voltage. 304 is a terminal to output the product $W_1V_1$ of input voltage $V_1$ and the weight $W_1$. The third terminal 305 is a input terminal for control signal $X_1$, the magnitude of which changes the weight $W_1$.

In other words, with this circuit configuration, the weight by which the input signal to the neuron element 301 is multiplied can freely be varied. This is very important in realizing a neuron computer because such weight coefficients momentarily change to carry out arithmetic operations in the biological information processing. Living things carry out sophisticated information processing such as recognition, association of idea and learning by varying such weights one after another based on the arithmetic operation. Namely, the structure of FIG. 3 is a most fundamental structure of a neuron computer. The weight-product circuits 302-1, 302-2, . . . 302-n will be discussed in detail later.

Since weighting input signals is carried out by the weight-product circuit in the structure of FIG. 3, the device 301 is not required to change the weights by changing the overlapping area between the floating gate and the input gate, unlike the example shown in FIGS. 1 and 2. This means that the device can be designed in such a manner that all the overlapping area are equal, leading to versatility of device. It is of course possible to determine the weight coefficients by using the variation of the area, material or thickness of insulating film, together with using weight-product circuit.

Figure 4:
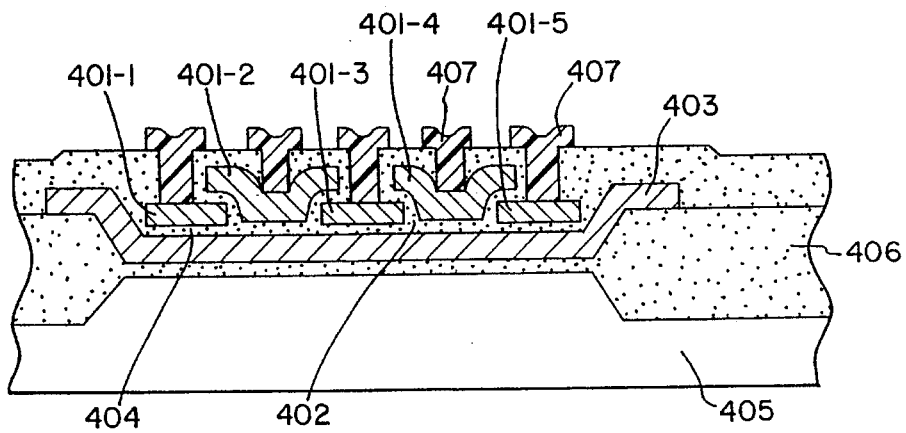
FIG. 4 is a cross-sectional view of a device explaining the embodiment 4.
Figure 5A:
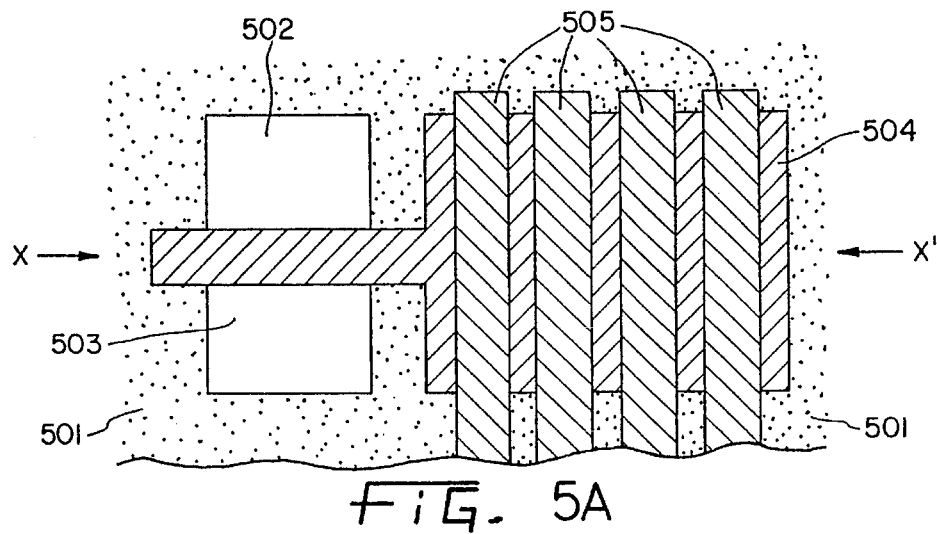
FIG. 5(a) is a plan view of a device and FIG. 5(b) is a cross-sectional view along X–X' line of FIG. 5(a).
Figure 5B:
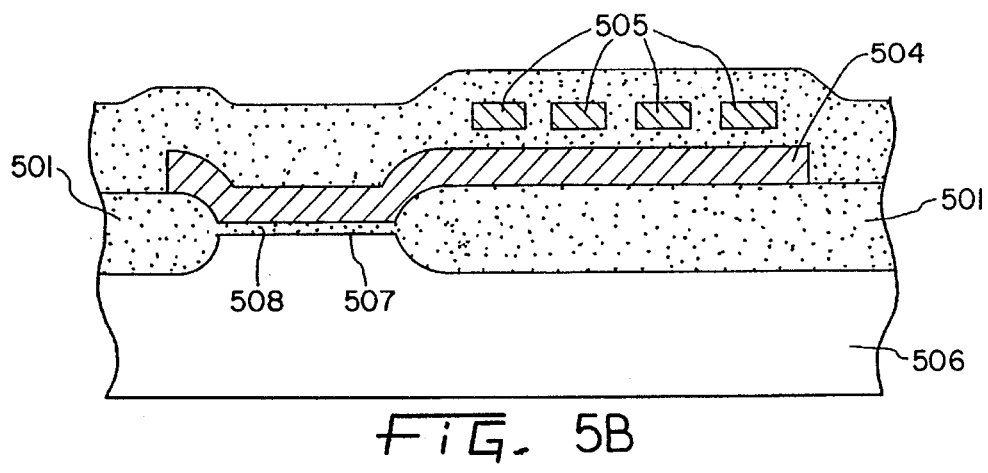
Figure 6:
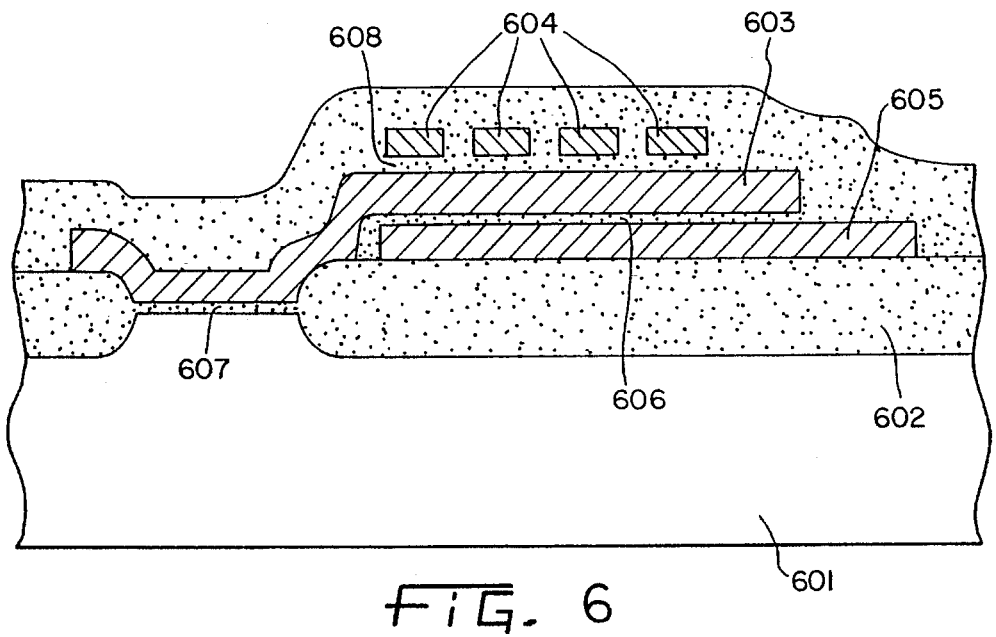
FIG. 6 is a cross-sectional view of a device explaining the embodiment 6.

FIGS. 4 to 6 are diagrams to explain the embodiments 4 to 6 illustrating the structure of various νMOS in which every overlapping area is equal.

(Embodiment 4 and 5)

In embodiments shown in FIG. 4, the gaps between adjacent input gates of 205-1 to 205-4 are designed to be small as compared with those of the embodiment 2 (FIG. 2) so that elements with smaller dimension can be realized. That is, in FIG. 2(c), the gap between input gates is determined by the resolution limit of lithographic process, but in the embodiment of FIG. 4 the input gate are formed partially one upon another and the gaps between adjacent input gates are equal to the thickness of the insulating film 402. This structure is constructed as follows. First, a floating gate 403 is formed. Next, an insulating film 404 such as a thermal oxidation film 401 and then input gates 401-1, 401-3 and 401-5 are formed on the surface of the floating gate 403. Then an insulating film is formed on these input gate surfaces. Finally, input gates 401-2, 401-4 are formed thereon. In the figure, 405, 406 and 407 denote a p-type Si substrate, a field oxide film and an Al interconnect, respectively.

FIG. 5 shows schematic diagrams explaining the embodiment 5. FIGS. 5(a) and 5(b) are a plan view and a cross-sectional view along X–X' line, respectively. 501 is a field oxide film region. 502 and 503 are a source and a drain regions. Al interconnects are omitted in the figure for simplicity. The feature of this embodiment is that the coupling between the floating gate 504 and input gates 505 is made on the surface of the field oxide film. In this structure, the overlapping area between the floating gate and each of input gates can be determined, regardless of the overlapping area between the floating gate and silicon substrate. Namely, since each portion of MOS transistor and coupling between the floating gate and input gate can be designed independently, the room for design choices of element becomes large. For example, if designed as $$C_1+C_2+C_3+C_4 \gg C_0$$

then $$C_{TOT} \approx C_1+C_2+C_3+C_4$$

and the following equation is obtained:

$$W_1+W_2+W_3+W_4 \approx 1. \tag{7}$$

The value of $W_1+W_2+W_3+W_4$ in the embodiments 1 and 2 are respectively 0.529 and 0.428; that is, less than 1. In other words, each value of weights can be made large by this embodiment.

When Eq. (4) was derived from Eq. (3), the potential $V_s$ of the substrate was assumed to be 0 V. This assumption is approximately correct, but strictly incorrect. The reason is described below. When the channel is formed on the semiconductor substrate surface 111 in FIG. 1(a), the potential of the channel becomes 0 V at the edge of the source region and gradually approaches to the drain potential as the position gets near the drain region. A large potential drop takes place in the vicinity of the drain region, so it is good approximation to assume the potential of whole channel to be about 0 V. Nevertheless, when a transistor comes to have a short channel, this assumption leads to error. And if the channel is formed on the silicon surface 111, the capacitive coupling coefficient $C_0$ between the floating gate and the Si substrate becomes nearly equal to a capacitance of gate oxidation film $C_{o\ x}$ which is given by $C_{o\ x}=\epsilon_0\epsilon_r S/t_{o\ x}$. Here, $\epsilon_0$ denotes vacuum dielectric constant, $\epsilon_r$ relative dielectric constant, and S the area of channel. However, when no channel appears, the depletion layer is formed on the silicon surface and $C_0$ is expressed as a series combination of $C_{o\ x}$ and a capacitance $C_D$ of the depletion layer, i.e., $C_0=(1/C_{o\ x}+1/C_D)^{-1}$. Here, $C_D=\epsilon_0\epsilon_r'S/W$, $\epsilon_r'$ denotes the dielectric constant of Si and W denotes the thickness of the depletion layer. $C_0$ changes as W changes with voltage difference between the floating gate and the substrate. Therefore, the value of $C_0 V_0$ in Eq. (3) does not remain constant, but changes depending on the operation condition of the device. Namely, the threshold value $V_{TH}^*$ given by Eq. (3) changes with this value. In general, this change causes little problem because of being small as compared with $V_{TH}^*$. However, it is desirable for high accuracy operation that $V_{TH}^*$ does not change at all. On the other hand, the inequality $C_0 \ll C_{TOT}$ holds in the embodiment 5 and the 2nd term of Eq. (3) is decreased to the value small enough to remove the problem of $V_{TH}^*$ variation.

(Embodiment 6)

FIG. 6 is a cross-sectional view explaining the sixth embodiment. 601 is e.g., a p-type Si substrate, 602 is a field oxide film, and 603 is a floating gate. 604 denotes four input gates. The feature of this embodiment is that another control gate 605 is formed under the floating gate through an insulating film 606. Here, $C_c$ denotes a capacitive coupling coefficient between the floating gate and control gate 605 and $C_{TOT}$ is assumed to be large enough as compared to $C_0$; i.e., $C_0/C_{TOT} \approx 0$ ($C_{TOT} \approx C_1+C_2+C_3+C_4$ and $C_1$–$C_4$ are capacitive coupling coefficients between the floating gate and each of four input gates). Then, Eq. (3) reduces to $$V_{TH}^*=V_{TH}-(C_c/C_{TOT})V_c. \tag{8}$$

Here, $V_c$ is potential of the control gate and $Q_F$ is assumed to be 0. Eq. (8) indicates that $V_{TH}^*$ can be controlled by $V_c$. In other words, if the circuit shown in FIG. 1(d) is constructed using vMOS shown in FIG. 6, the threshold $V_{TH}^*$ with which $V_{OUT2}$ changes from 0 V to $V_{DD}$ to input can be changed by the input voltage applied to the control gate, indicating that the threshold of neuron operation can be changed and a neuron computer can be designed more flexibly.

Such a variable threshold function is not restricted to the structure of FIG. 6. In each case of FIGS. 1, 2, 4 and 5, the same function is realized by utilizing one of input gates as a control gate.

For the case $Q_F \neq 0$ in Eq. (3), Eq. (8) is revised as $$V_{TH}^*=V_{TH}-(C_c/C_{TOT})V_c-Q_F/C_{TOT}. \tag{9}$$

Under the condition $V_c=0$, this device operates with $$V_{TH}^*=V_{TH}-Q_F/C_{TOT}. \tag{10}$$

First, if the device is assumed to be under the condition $Q_F=0$, $V_{TH}^*=V_{TH}$. Then, a voltage of +20 V is applied to every input gate 604 under the condition of $V_c=0$ ($V_1=V_2=V_3=V_4=20$ V). If the device is designed so that $(C_1+C_2+C_3+C_4):C_c=4:1$, then $V_F=16$ V. The thickness of the gate oxide film 607 in the channel region is, e.g., 100 A. The voltage of 16 V applied to the gate oxide film causes electron to flow through the oxide film to the floating gate; the electron injection to the floating gate occurs, resulting in $Q_F<0$. From Eq. (10), $V_{TH}^*$ is expressed as follows:

$$V_{TH}^*=V_{TH}+|Q_F|/C_{TOT},$$

indicating that $V_{TH}^*$ becomes larger by $|Q_F|/C_{TOT}$ than that before electron injection. The $V_{TH}^*$ variation can be controlled by controlling the voltage applied to each input gate; $V_{TH}^*$ can be changed from 20 V for the case of $V_1=V_2=V_3=V_4$. It is also possible that each input gate has different voltage. On the other hand, in the case where $V_1=V_2=V_3=V_4=-20$ V, the electron is discharged from the floating gate, resulting in $Q_F>0$. In this case, $$V_{TH}*=V_{TH}-Q_F/C_{TOT}.$$

Namely, the threshold becomes small as compared with that before injection. The electron discharge is also carried out under the condition that $V_1=V_2=V_3=V_4=0$ V and $V_c=-20$ V.

As mentioned above, the electron injection or discharge through a insulating film which is carried out by controlling the potential of floating gate 603. As a result, the amount of charge in the floating gate can be controlled. Namely, the threshold of the neuron element can be changed according to Eq. (10). When $V_{TH}*$ is controlled by this method, its value is maintained unchanged until the next injection or discharge is carried out. That is, the value of $V_{TH}*$ is memorized even if a power supply of the circuit is cut off. In the explanation of FIG. 6, the electron injection or discharge through a gate oxide film is described, but this can also be made at other portions; for example, an oxide film 606 between the floating gate and the control gate 605 or an oxide film 608 between the floating gate and input gate 604. It is also possible to make injection or discharge through a portion of oxide film 606, 607, 608 which is formed to be thin. In FIG. 6, different voltages are applied to the control gate 605 and the input gate 604 to control the injection or discharge. The injection or discharge is also made by applying different voltages to each of input gates. Namely, it is needless to particularly prepare control gate such as 605. For example, in the examples in FIGS. 1, 2, 4 and 5, the same operation can apparently be made by controlling the voltage applied to each input gate. But in any case the injection and discharge must be prevented from occurring during ordinary switching operation. Thus, higher voltage must be required for the injection or discharge operation than for switching operation.

A neuron element using vMOS of this invention is realized in configurations such as that shown in FIG. 1(d), where the resistor 122 is used as a load element connected to vMOS 124. Other elements can be used instead of a resistor. The examples are shown in FIGS. 7(a) and 7(b).

Figure 7A:
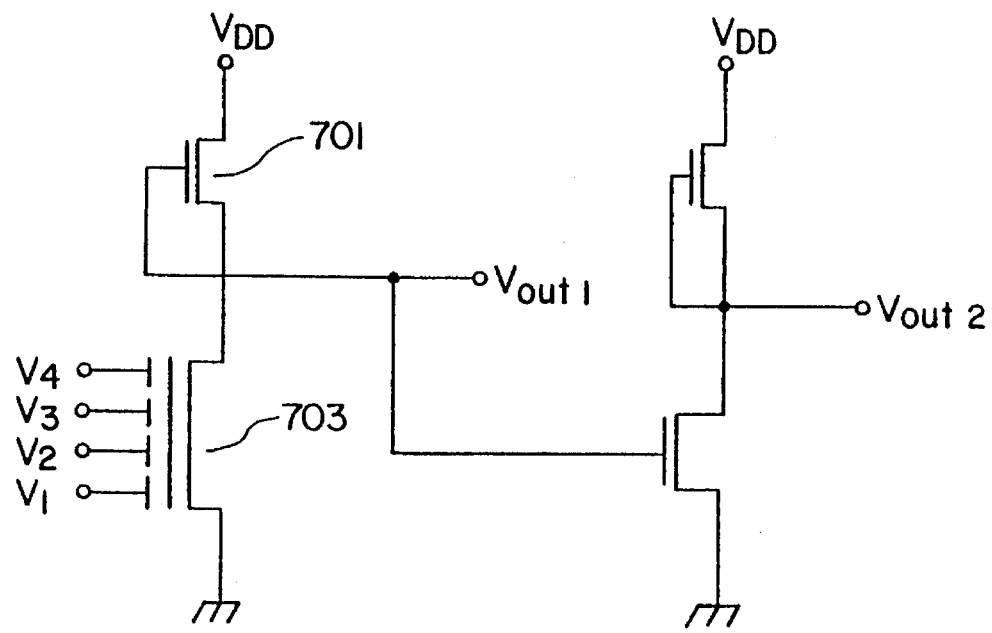
FIG. 7 is a diagram of a circuit illustrating another example.
Figure 7B:
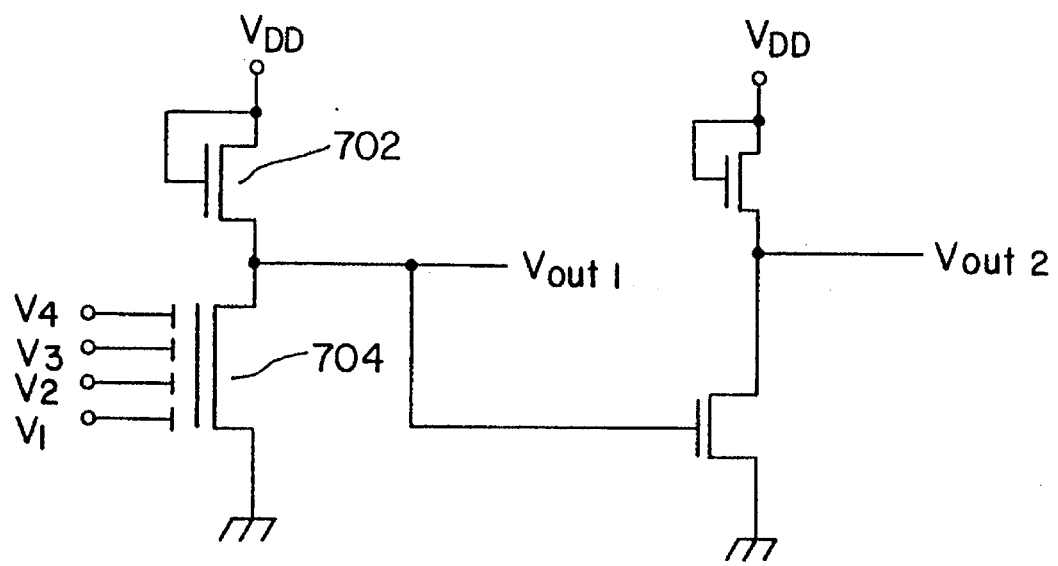

In FIGS. 7(a) and 7(b), n-channel depletion mode MOS transistor 701 and n-channel enhancement mode transistor 702 are used as a load element, respectively. An n-channel vMOS is formed on a p-type substrate in FIGS. 1, 2, 4, 5, 6 or 7. The same function can also be realized for the case where a p-channel vMOS is formed on a n-type substrate.
(Embodiment 7)

Figure 8A:
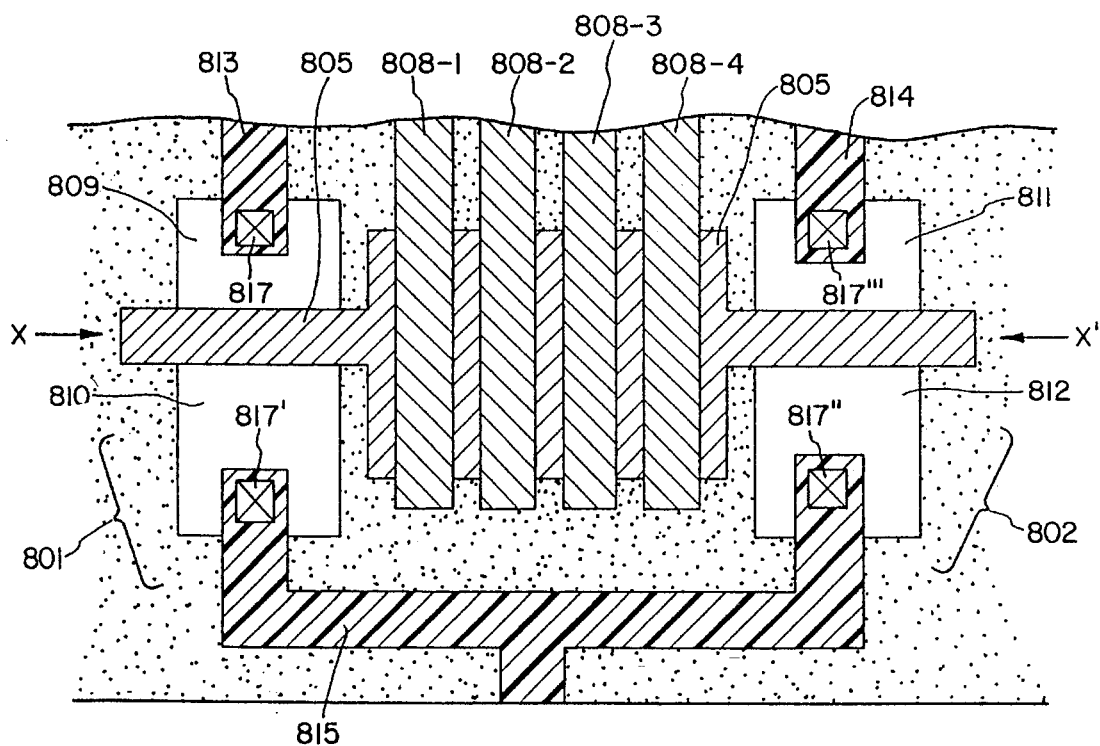
FIG. 8(a) is a plan view of device.
Figure 8B:
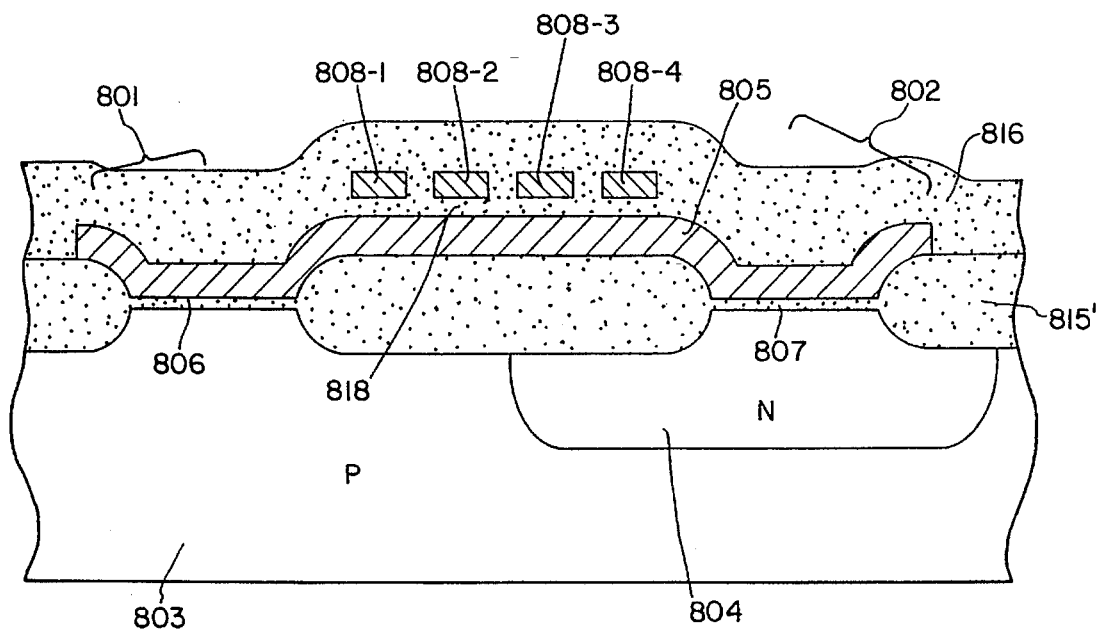
FIG. 8(b) is a cross-sectional view along X–X' line of FIG. 8(a) and FIG. 8 (c) is a graph showing characteristics.

As a method for constructing a neuron element using vMOS of this invention, the configuration such as those in FIGS. 1(d), 7(a) and 7(b) have been described so far. These configurations have such a problem that direct current flows from $V_{DD}$ to the ground when vMOS 124, 703, 703 is under conductive condition. Particularly in the case where vMOS is connected to an NMOS inverter as shown in the figure, stand-by current always flows through either one of two paths when $V_{out2}$ is at HIGH and LOW levels. This is undesirable from a viewpoint of power dissipation. The output of $V_{out1}$ is at low level when $Z>V_{TH}*$. However, it is not exactly 0, but $V_{DD} \times R_{ON}/(R_{ON}+R_L)$. Here, $R_{ON}$ is on-resistance of vMOS and $R_L$ is a resistance of load element. Since the value of $R_{ON}$ and $R_L$ are usually designed so that $R_{ON} \ll R_L$, the output voltage becomes nearly zero. But the output of exactly 0 V is preferable. The embodiment 7 is demonstrated as an example to meet these requirements. FIG. 8(a) is a plan view explaining the embodiment 7 and FIG. 8(b) is a cross-sectional view along X–X' line of FIG. 8(a).

801 is an n-channel vMOS formed on a p-type substrate 803, 802 is a p-channel vMOS formed on a n-type substrate 804. 805 is a floating gate formed over the p-type substrate 803 and the n-type substrate 804 through insulating films 806 and 807. 808-1, 808-2, 808-3 and 808-4 are input gates. 809 and 810 are n$^+$ source and n$^+$ drain, respectively. 811 and 812 are p$^+$ source an p$^+$ drain, respectively. 813, 814, and 815 are Al interconnects; 813 is connected to $V_{ss}$ (ground) potential and 814 to VDD (positive supply voltage, e.g., 5 V). 815' is a field oxide film and 816 is an insulating film under Al interconnects. 817, 817', 817" and 817'" are contact holes formed in the insulating film 816. In NMOS and PMOS, a gate length, a gate width and thickness of a gate film are, for example, 1 μm, 3 μm and 200 A, respectively.

All overlapping regions between the floating gate and each input gate have the same area of 4.5 μm$^2$. The insulating film between them is made of 100 A thick SiO$_2$. In this case, let Z denote the potential of floating gate, which is given by $$Z=0.214(V_1+V_2+V_3+V_4). \quad (11)$$

Figure 8C:
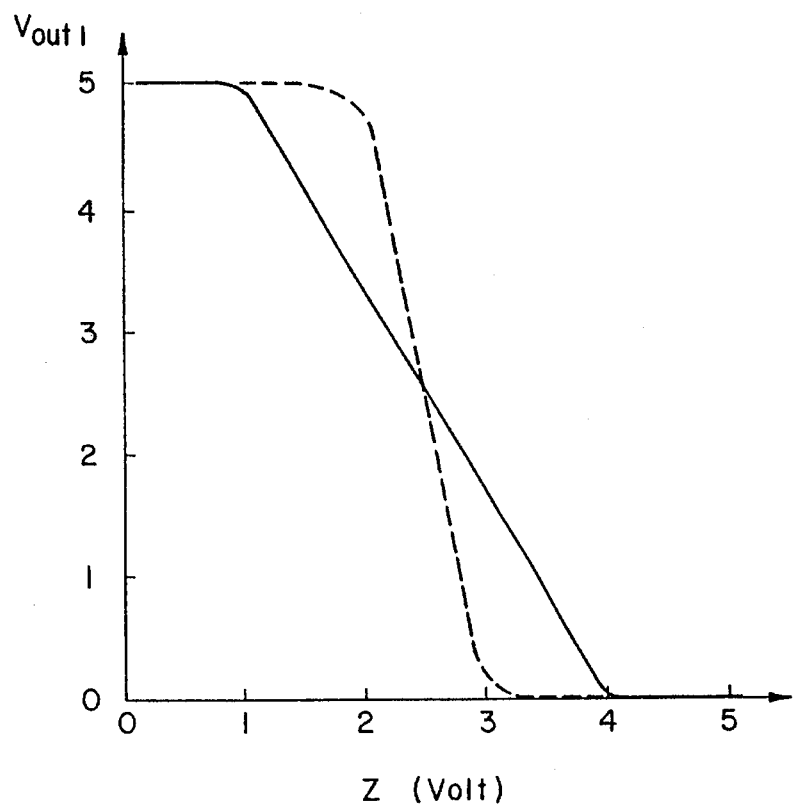
FIG. 8 shows diagrams explaining the embodiment 7.

Here, $V_1$, $V_2$, $V_3$ or $V_4$ is input voltage applied to respective input gate. When a threshold voltage $V_{Tn}*$ of n-channel vMOS 801 and a threshold voltage $V_{Tp}*$ of p-channel vMOS 802 as seen from the floating gate are set to be 1 V and −1 V, respectively, the potential $V_{out1}$ of 815 to Z is shown by the solid line of FIG. 8(c). When Z<1 V, n-channel vMOS 801 turns off and p-channel vMOS 802 turns on. Therefore, $V_{out1}$ becomes 5 V. When Z<4 V, on the other hand, p-channel vMOS 802 turns off and n-channel vMOS 801 turns on and then $V_{out1}$ becomes 0 V. This means that the low level is exactly outputted and no stand-by current flows at the low level, indicating that a neuron element dissipating little power can be formed. The broken line in FIG. 8(c) shows the relationship between Z and $V_{out1}$ when $V_{Tn}=2$ V and $V_{Tp}=-2$ V. in this case, the characteristics steeply changes from 5 V to 0 V. This characteristics can be controlled by the selection of $V_{Tn}$ and $V_{Tp}$. The 7th embodiment of this invention is a vMOS having an excellent characteristics of low power dissipation. Both n-channel vMOS and p-channel vMOS share the same floating gate and complementarily control the on and off each other, so this vMOS is called complementary vMOS or C-vMOS in short.

So far only the case where vMOS is formed on the bulk Si wafer has been described, but the device of this invention can also be formed on, for example, SOI substrate, i.e., silicon layer on an insulating film.
(Embodiment 8)

Figure 9:
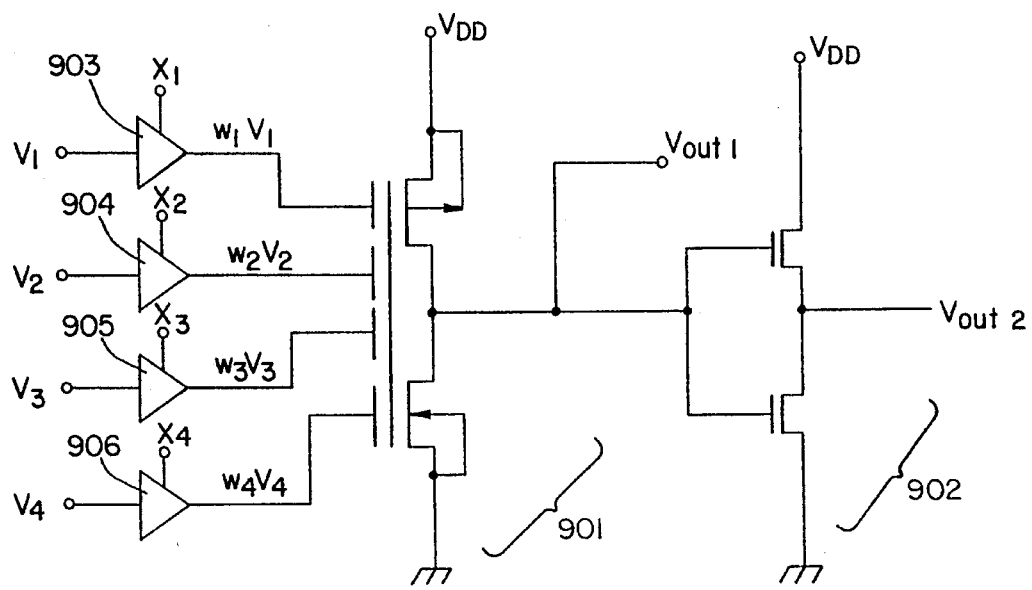
FIG. 9 is a diagram of circuit explaining the embodiment 8.

FIG. 9 shows the 8th embodiment of the invention and an example of the configuration of neuron element using C-vMOS. 901 is a symbol of 4-input-gate C-vMOS and 902 is a CMOS inverter. 903, 904, 905 and 906 are the circuits which multiply input voltage $V_1$, $V_2$, $V_3$ and $V_4$ by respective weight coefficients $W_1$, $W_2$, $W_3$ and $W_4$ determined by the control voltages $X_1$, $X_2$, $X_3$ and $X_4$ and then output weighted voltages to the input gates of C-vMOS. The output of $V_{out2}$ is LOW when $V_{out1}$ is HIGh, and HIGH when $V_{out1}$ is LOW. In both cases of $V_{out2}$ being at HIGH and LOW levels, no stand-by current flows in C-vMOS 901 or CMOS inverter 902. Although 801-1 to 801-4 are all used as input gates in the examples of FIGS. 8 and 9, at least one of these can be used as a control gate like 605 as described in FIG. 6. $V_{Tn}$ and $V_{Tp}$ are controlled, for example, by applying a fixed voltage to 801-1. The control gate such as 605 can be prepared separately. It is needless to say that the injection of charge to the floating gate is also utilized.

Figure 10:
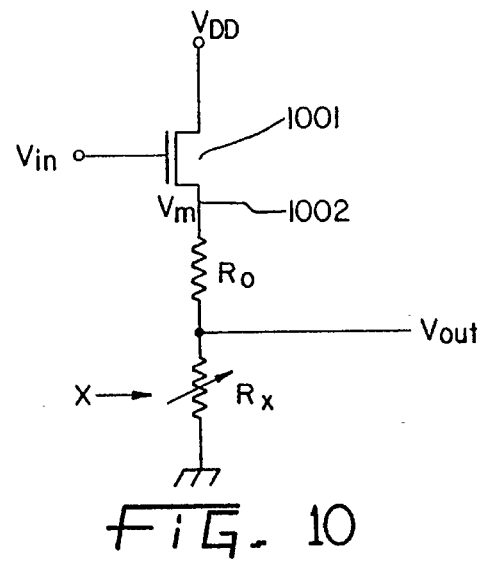
FIGS. 10 and 11 are diagrams of a circuit illustrating other examples.

Next, the weight-product circuit demonstrated in FIGS. 3 and 9 (302-1 to 302-n, 903, 904, 905 and 906) is described below. FIG. 10 is a circuit demonstrating an example of weight-product circuit. For example, 1001 is NMOS having a threshold $V_{TH}$ of about 0 V. $R_0$ denotes a resister and $R_x$ a variable resistor controlled by input voltage X. Let $V_m$ denote the potential at 1001, which is given by $V_m=V_{in}-V_{TH}$. If $V_{TH}=0$, then $V_m=V_{in}$. Therefore, the output voltage $V_{out}$ is given by $$V_{out}=V_{in}\cdot R_x/(R_0+R_x). \quad (12)$$

Figure 11:
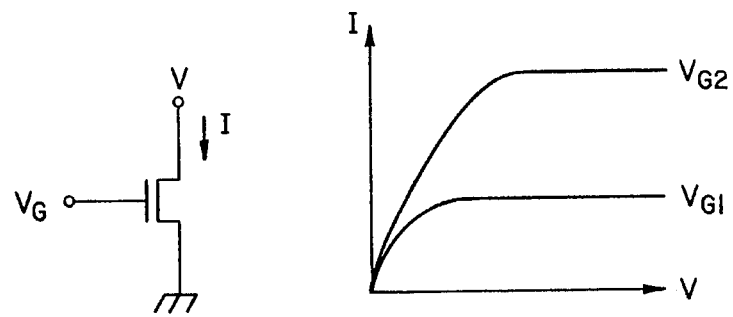

Namely, this circuit has such a function that input $V_{in}$ is multiplied by weight coefficient of $R_x/(R_0+R_x)$ and then outputted. Therefore, if the value $R_x$ of a variable resistor is controlled by input voltage X, the weight coefficient can arbitrarily be changed. Such a variable resistor can be realized using one MOSFET as shown in FIG. 11. When a constant voltage $V_G$ is applied to the gate, the current-voltage characteristics becomes as shown in the figure, indicating that MOSFET is used for a variable resistor. However, as is apparent from the figure, much attention must be paid to the design of the circuit because of strong nonlinearity.

(Embodiment 9)

Figure 12:
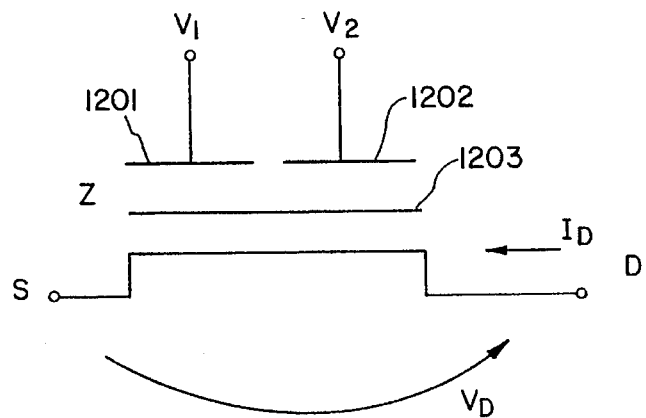
FIG. 12 is a schematic diagram of a circuit explaining the embodiment 9.

It will be described below that a variable resistor with excellent linearity is realized by using vMOS of this invention. First, the characteristic of vMOS is generally analyzed. FIG. 12 shows a symbol of vMOS with two input gates 1201, 1202 where $V_D$ denote the drain potential when a source is grounded, $V_1$ and $V_2$ the input gate potentials, and Z the potential of the floating gate 1203. Here, L and W denote a channel length and a channel width of vMOS, respectively and $V_{TH}$ denote the threshold voltage as seen from the floating gate. Then the drain current $I_D$ is expressed by the following equation:

$$I_D=(W/L)\mu_n C_0[(Z-V_{TH})V_D-(\tfrac{1}{2})V_D^2] \quad (12')$$

Here, $\mu_n$ is surface electron mobility and $C_0$ is a capacitance of a gate oxide film under the floating gate. Z is give by $$Z=W_1V_1+W_2V_2. \quad (13)$$

where $$W_1=C_1/(C_0+C_1C_2)$$

$$W_2=C_2/(C_0+C_1+C_2).$$

Figure 13A:
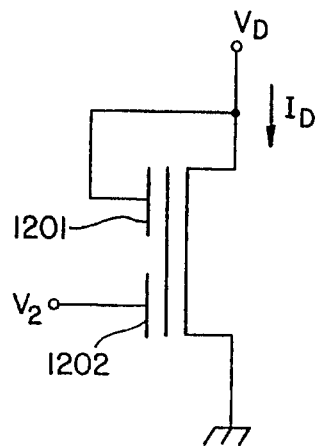
FIG. 13(a) is a diagram of a circuit and FIG. 13(b) is a graph showing characteristics.

The 9th embodiment of this invention is shown in FIG. 13. The first input gate 1201 of vMOS is connected to a drain and a constant voltage is applied to the second input gate 1202. If $V_1=V_D$ is substituted into Eq. (13) and then Eq. (12'), $I_D$ is obtained as $$\begin{aligned} I_D &= (W/L)\mu_n C_0[(W_1V_D+W_2V_2-V_{TH})V_D-(1/2)V_D^2] \\ &= (W/L)\mu_n C_0[(W_1-1/2)V_D^2+(W_2V_2-V_{TH})V_D] \end{aligned}$$

Here, if we take $W_1=\tfrac{1}{2}$, the term of $V_D^2$ disappears and the following equation is obtained:

$$I_D=(W/L)\mu_n C_0[(W_2V_2-V_{TH})V_D] \quad (14)$$

Figure 13B:
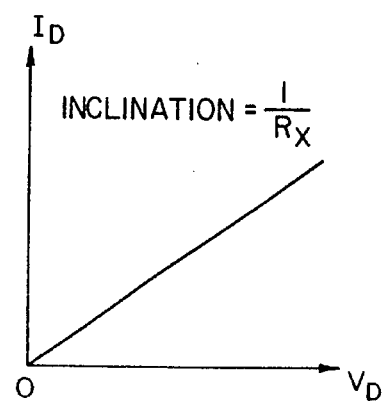

As is shown in FIG. 13(b), $I_D$ is proportional to $V_D$, indicating that vMOS acts as a linear resistance element. The resistance $R_x$ for direct current as seen from the outside is given by $$(1/R_x)=(W/L)\mu_n C_0(W_2V_2-V_{TH}). \quad (15)$$

In other words, the value of resistance can be controlled by the value of $V_2$. For $R_x>0$ in Eq. (15)

$$W_2V_2-V_{TH}>0 \quad (16)$$

Therefore, $W_2$ and $V_{TH}$ must be determined so that Eq. (16) holds. If the depletion mode vMOS is employed, $V_{TH}<0$; that is, Eq. (16) always holds. For $W_1=\tfrac{1}{2}$, $$C_1/(C_0+C_1+C_2)$$

i.e., $$C_0+C_2=C_1$$

For this reason, it is desirable to employ the structure which is shown in FIG. 5 as the embodiment 5 of the invention and can lessen the effect of $C_0$. By using the circuit of FIG. 13(a) for $R_x$ of FIG. 10, the resistance value can be controlled by the value of $V_2$ and thus ideal weight-product circuit can be realized. As has been mentioned, vMOS can effectively be applied to various circuits.

So far the charge in the floating gate has been assumed to be zero. For the case of charge $Q_F$ being not zero, the resistance in Eq. (15) is revised to $$(1/R_x)=(W/L)\mu_n C_0(W_2V_2-V_{TH}+Q_F/C_{TOT}). \quad (15')$$

As described in the embodiment 6, the value of resistance can be memorized by making use of the phenomenon of electron injection to the floating gate or electron discharge from the floating gate. The voltage is applied to $V_2$ only when electron injection is made. $V_2$ is kept constant during ordinary operation.

(Embodiment 10)

All neuron circuits which has been described so far are constructed using single positive supply voltage. Therefore, all signals have only positive value and negative signal cannot be handled.

Figure 14A:
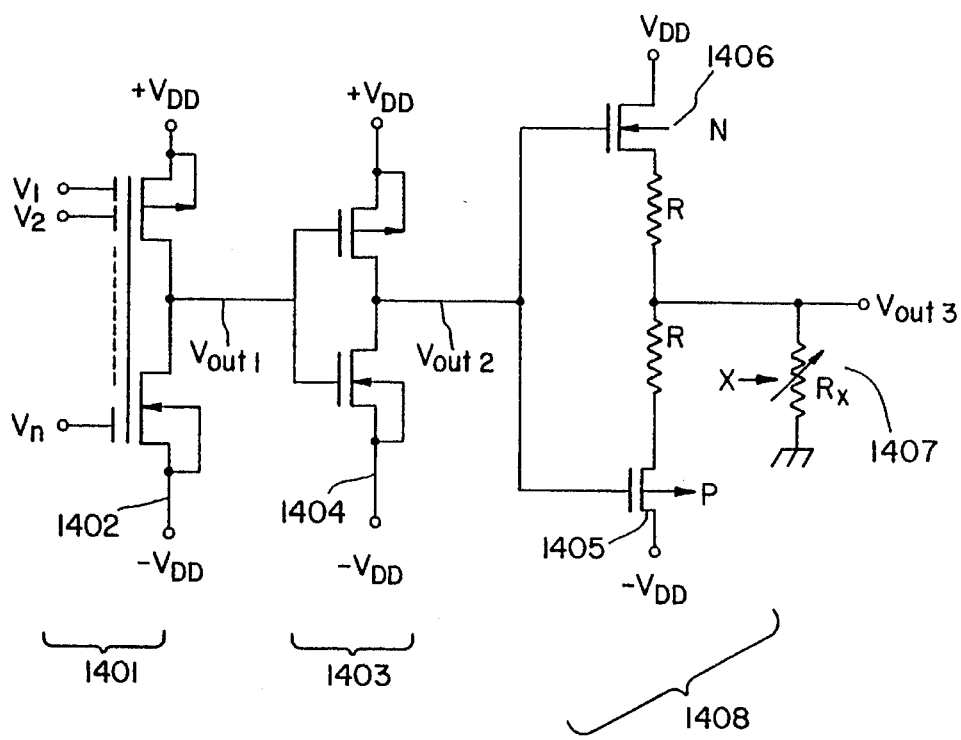
FIG. 14 is a schematic diagram of circuit explaining the embodiment 10.
Figure 14B:
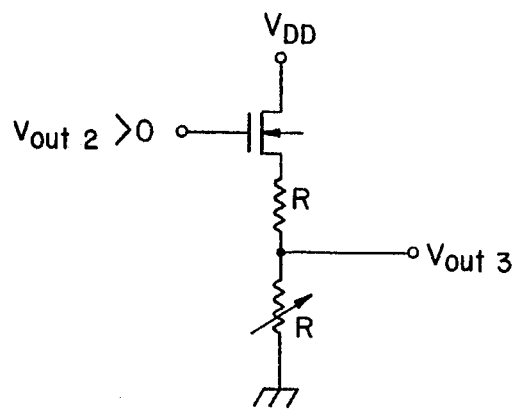

FIG. 14 is a circuit of the embodiment 10 which can deal with both positive and negative signals. 1401 is a C-vMOS such as that described in FIG. 8. The source 1402 of n-channel vMOS is connected to a negative supply voltage $(-V_{DD})$. 1403 is a CMOS inverter. The source 1404 of NMOS is also connected to $(-V_{DD})$. 1405 and 1406 are, respectively, p-channel MOS and n-channel MOS, the thresholds of which are set nearly 0 V. $V_1, \ldots, V_n$ are inputs with positive or negative value. $V_{out2}=+V_{DD}$ if $Z>V_{TH}^*$ and $-V_{DD}$ if $Z<V_{TH}^*$. Then, the operation of the circuit 1408 is discussed. When $V_{out2}$ is positive, PMOS 1405 turns off and 1408 is expressed by FIG. 14(b). Then, $V_{out3}$ is given by $$V_{out3}=(R_x/(R+R_x))V_{out2}. \quad (17)$$

Figure 14C:
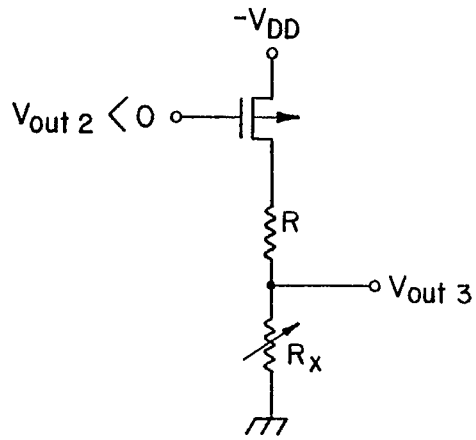

The $V_{out3}$ outputs positive values. In the case of $V_{out2}$ being negative, on the other hand, NMOS turns off and 1408 is shown by FIG. 14(c). Namely, $$V_{out3}=(R_x/(R+R_x))V_{out2}. \quad (18)$$

Therefore, the negative value is outputted, suggesting that multiplication of weight coefficients which takes the sign into account can be made. Making use of a circuit such as 1408 for 903 to 906 in FIG. 8(c), a neuron circuit can be constructed which is capable of dealing with both positive and negative signals. As a variable resistor of this circuit, vMOS circuit shown in the embodiment 9 can be used.

Figure 15:
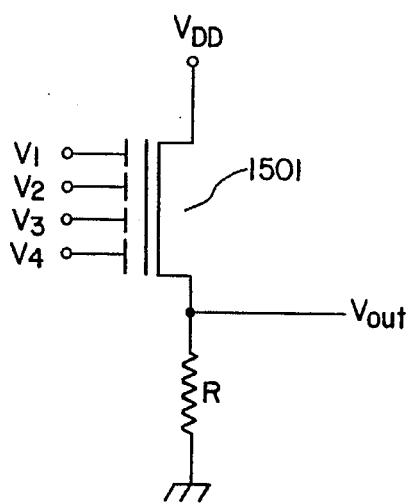
FIG. 15 is a schematic diagram of circuit explaining the embodiment 11.

(Embodiment 11)

vMOS is applied to various elements for neural computer as mentioned above and also has wide application in other fields. FIG. 15 is a circuit of the embodiment 11. 1501 is a four-input-gate vMOS and the input voltages $V_1$, $V_2$, $V_3$, $V_4$ are applied to respective input gates. Let Z denote the floating gate potential, which is given by: $Z=W_1V_1+W_2V_2+W_3V_3+W_4V_4$. Then, $$V_{out}=Z-V_{TH}$$

Here, $V_{TH}$ is the threshold of MOS as seen from the floating gate. In the case of $V_{TH}$ being nearly 0 V, $V_{out}$ is expressed as $$V_{out}=W_1V_1+W_2V_2+W_3V_3+W_4V_4$$

This is a circuit to output a linear sum of weighted input voltage. Such function is very useful for, e.g., multi-valued logic circuit. The circuit with this function dissipates very little power as compared with the circuit which performs sum operation of voltage by making use of current additivity. Also the remarkable improvement of integration density is achieved because the circuit is realized with a single element.

(Embodiment 12)

Figure 16:
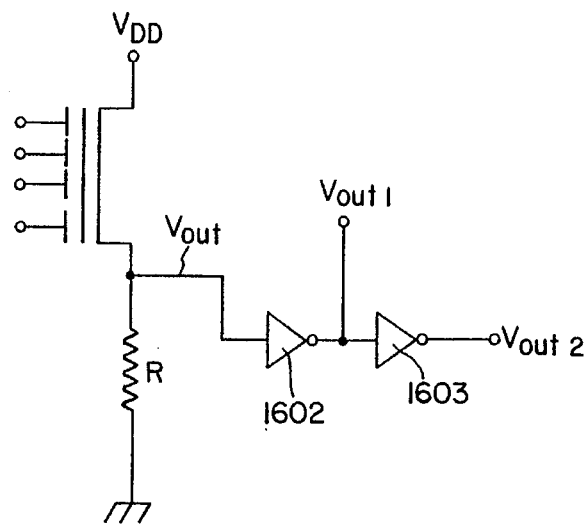
FIG. 16 is a schematic diagram of circuit explaining the embodiment 12.

FIG. 16 shows the 12th embodiment which is an example of neuron circuits using the circuit shown in FIG. 15. $V_{out}$ is connected to 2-stage inverters 1602, 1603 and $V_{out2}$ is outputted. The threshold of the inverter 1602 is defined as $V_{TH}$. When $W_1V_1+W_2V_2+W_3V_3+W_4V_4 > V_{TH}$, the output of $V_{out}$ becomes HIGH. Namely, this circuit apparently performs a neuron function. As inverters 1602, 1603, E-R type, E-E type or E-D type of NMOS or CMOS type inverter can be used.

(Embodiment 13)

Figure 17:
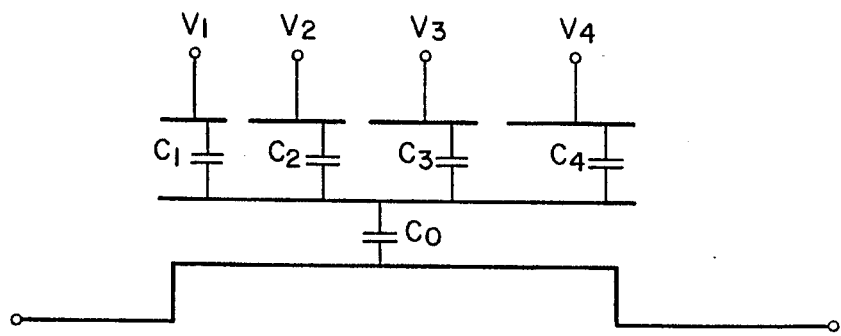
FIG. 17 is a schematic diagram of circuit explaining the embodiment 13.

FIG. 17 is a structure of vMOS illustrating the 13th embodiment. Capacitive coupling coefficients between a floating gate and four input gates are indicated by $C_1$, $C_2$, $C_3$ and $C_4$ and are designed so that $C_2=2C_1$, $C_3=4C_1$ and $C_4=8C_1$. The floating gate potential Z is given by $$\begin{aligned} Z &= (C_1/C_{TOT})V_1 + (C_2/C_{TOT})V_2 + (C_3/C_{TOT})V_3 + (C_4/C_{TOT})V_4 \quad (19) \\ &= (C_1/C_{TOT})(V_1 + 2V_2 + 4V_3 + 8V_4). \end{aligned}$$

Here, if the values of $V_1$, $V_2$, $V_3$ and $V_4$ ares either of 1 or 0, the number of $(V_1+2V_2+4V_3+8V_4)$ in Eq. (19) corresponds to decimalized number of binary number $(V_4, V_3, V_2, V_1)$. In other words, Z indicates the voltage proportional to the decimal number into which binary number is transformed. Therefore, when vMOS of FIG. 17 is used for vMOS in FIG. 15, $V_{out}$ outputs the voltages which are obtained by D-A conversion of binary numbers $(V_4, V_3, V_2, V_1)$ As described above, D-A conversion can be carried out using a single vMOS. This is an important application of vMOS.

(Embodiment 14)

Figure 18:
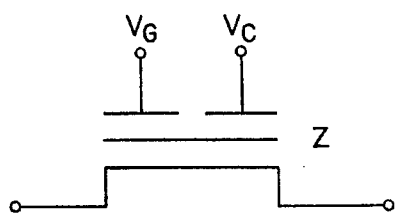
FIG. 18 is a schematic diagram of circuit explaining the embodiment 14.

FIG. 18 is the 14th embodiment of this invention illustrating vMOS having two input gates $V_G$ and $V_o$. Here, Z denotes the floating gate potential, and $V_{TH}$ denotes the threshold as seen from the floating gate. Then, Z is given by $$Z=W_1V_G+W_2V_o.$$

The transistor turns on when $Z > V_{TH}$, i.e., $$W_1V_G+W_2V_o > V_{TH}.$$

When $$V_G > (1/W_1)(V_{TH}-W_2V_o) \quad (20)$$

this vMOS turns on. By assuming vMOS to be a single MOSFET having a gate $V_G$, this vMOS can be regarded as a transistor having a new threshold value $V_{TH}^*$. Here, $$V_{TH}^*=(1/W_1)(V_{TH}-W_2V_o). \quad (21)$$

As is apparent from Eq. (21), the threshold can be changed by applied voltage $V_o$. Such a transistor whose threshold value can be changed by the external signal has not existed up to now. This transistor is a very important circuit element to construct a multi-valued logic integrated circuit. This vMOS can easily realize the circuit without various ideas and considerations which have been proposed up to now.

(Application to Industries)

As mentioned above, vMOS of the present invention makes it possible to realize a neuron computer having low power dissipation and high integration density, which have been thought to be impossible to realize. vMOS can be applied to various fields including, for example, D-A converter, linear adder, analog circuit such as variable threshold transistor, and multi-valued logic circuit.

What is claimed is:

1. An integrated circuit having at least a first semiconductor device and a second semiconductor device, said first semiconductor device comprising at least four electrodes, wherein the current flowing in a P-type semiconductor region through a first electrode and a second electrode is controlled by a third electrode and the way of controlling the current is controlled by a fourth electrode in such a manner that a positive increment in the voltage given to said third or said fourth electrode results in an increase in said current flowing in said P-type semiconductor region through said first and said second electrodes, said second semiconductor device comprising at least four electrodes wherein the current flowing in an N-type semiconductor region through a first electrode and a second electrode is controlled by a third electrode and the way of controlling the current is controlled by the fourth electrode in such a manner that a positive increment in the voltage given to said third or said fourth electrode results in a decrease in said current flowing in said N-type semiconductor region through said first and said second electrodes of said second semiconductor device, said first electrode of said first semiconductor device being connected to said first electrode of said second semiconductor device.

2. The integrated circuit according to claim 1, wherein said second electrode of said first semiconductor device is connected to a ground line and said second electrode of said second semiconductor device is connected to a power supply line.

3. The integrated circuit according to claim 1, wherein said second electrode of said first semiconductor device is connected to a power supply line and said second electrode of said second semiconductor device is connected to a ground line.

4. The integrated circuit according to claim 3 wherein the voltage of said power supply line is positive with respect to said ground line.

5. An integrated circuit having a semiconductor device, said semiconductor device comprising at least four electrodes, wherein the current flowing in a P-type semiconductor region through a first electrode and a second electrode is controlled by a third electrode and the way of controlling the current is controlled by the fourth electrode in such a manner that a positive increment in the voltage given to said third or said fourth electrode results in an increase in said current flowing in said P-type semiconductor region through said first and second electrodes, said first electrode connected to a ground line and said second electrode connected to a power supply line through a single load device.

6. The integrated circuit according to claim 5, wherein the voltage of said power supply line is positive with respect to said ground line.

7. An integrated circuit having a semiconductor device, said semiconductor device comprising at least four electrodes, wherein the current flowing in a P-type semiconductor region through a first electrode and a second electrode is controlled by a third electrode and the way of controlling the current is controlled by the fourth electrode in such a manner that a positive increment in the voltage given to said third or said fourth electrode results in an increase in said current flowing in said P-type semiconductor region through said first and second electrodes, said first electrode connected to a ground line through a single load device and said second electrode connected to a power supply.

8. The integrated circuit according to claim 7, wherein the voltage of said power supply line is positive with respect to said ground line.

9. An integrated circuit having a semiconductor device, said semiconductor device comprising at least four electrodes, wherein the current flowing in an N-type semiconductor region through a first electrode and a second electrode is controlled by a third electrode and the way of controlling the current is controlled by the fourth electrode in such a manner that a positive increment in the voltage given to said third or said fourth electrode results in a decrease in said current flowing in said N-type semiconductor region through said first and second electrodes, said first electrode connected to a power supply line and said second electrode connected to a ground line through a single load device.

10. The integrated circuit according to claim 9, wherein the voltage of said power supply line is positive with respect to said ground line.

11. An integrated circuit having a semiconductor device, said semiconductor device comprising at least four electrodes, wherein the current flowing in an N-type semiconductor region through a first electrode and a second electrode is controlled by a third electrode and the way of controlling the current is controlled by the fourth electrode in such a manner that a positive increment in the voltage given to said third or said fourth electrode results in a decrease in said current flowing in said N-type semiconductor region through said first and second electrodes, said first electrode connected to a power supply line through a single load device and said second electrode connected to a ground line.

12. The integrated circuit according to claim 11, wherein the voltage of said power supply line is positive with respect to said ground line.

\* \* \* \* \*